(12) United States Patent
Morgan

(10) Patent No.: US 8,792,578 B2
(45) Date of Patent: Jul. 29, 2014

(54) METHOD AND APPARATUS OF SWITCHED AMPLIFICATION HAVING IMPROVED EFFICIENCY

(75) Inventor: Dennis R. Morgan, Morristown, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 437 days.

(21) Appl. No.: 13/117,267

(22) Filed: May 27, 2011

(65) Prior Publication Data

US 2012/0300858 A1 Nov. 29, 2012

(51) Int. Cl.
*H04L 25/34* (2006.01)
*H04L 25/49* (2006.01)

(52) U.S. Cl.
USPC .......................... 375/286; 375/241; 375/242

(58) Field of Classification Search
USPC .......................... 375/241, 242, 243, 245, 286
See application file for complete search history.

(56) References Cited

U.S. PATENT DOCUMENTS

| 4,132,950 | A | * | 1/1979 | Cochran et al. | ............ 455/183.2 |
| 5,617,058 | A | * | 4/1997 | Adrian et al. | .................. 330/10 |
| 7,920,023 | B2 | * | 4/2011 | Witchard | ........................ 330/10 |
| 2006/0091945 | A1 | * | 5/2006 | Wegner | ........................... 330/10 |
| 2006/0202754 | A1 | * | 9/2006 | Yamamura et al. | ............. 330/75 |

FOREIGN PATENT DOCUMENTS

WO PCT/US2012/036219 7/2012

* cited by examiner

*Primary Examiner* — Qutbuddin Ghulamali
(74) *Attorney, Agent, or Firm* — Wolff & Samson, PC

(57) ABSTRACT

A signal coding technique for switching amplifiers includes quantizing the amplitude A(t) of an input signal to produce a time series Â(t) having M levels; modulating a clock signal in response to Â(t), thereby to produce a control signal; switching among at least three different power supply output levels in response to the control signal, thereby to generate an output pulse stream; and filtering the output pulse stream to produce an output signal for transmission.

19 Claims, 15 Drawing Sheets

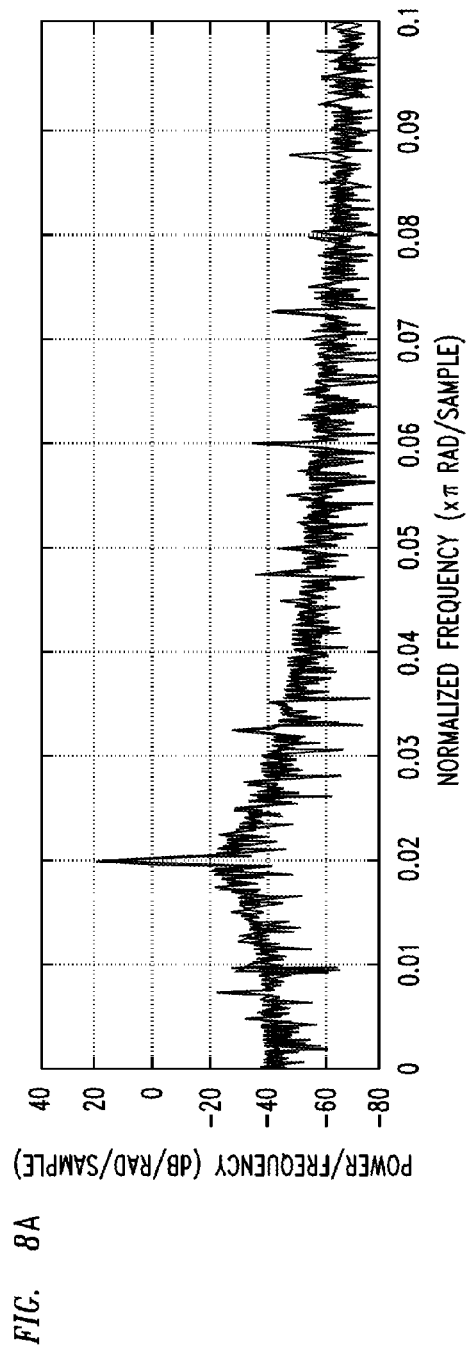
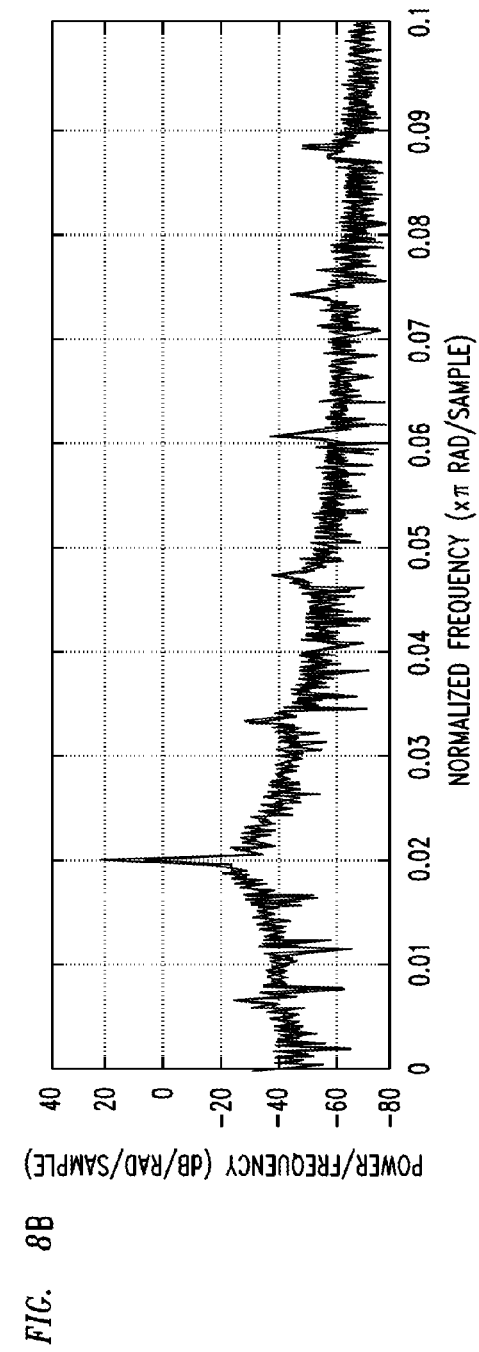
FIG. 8A
FIG. 8B

METHOD AND APPARATUS OF SWITCHED AMPLIFICATION HAVING IMPROVED EFFICIENCY

FIELD OF THE INVENTION

The invention relates to electronic amplification of radiofrequency signals, and more particularly to switching amplifiers for power amplification in communication systems.

ART BACKGROUND

The power amplifier is typically the last stage in the processing of signals for transmission from a wireless base station. Power efficiency is a critical performance metric for these and similar amplifiers. In a base station, for example, the power amplifiers may account for as much as half the total power expenditure. Both to reduce operating costs and to mitigate thermal loads, there is a need to improve the efficiency of power amplifiers.

Several well-known techniques have been applied to improve power efficiency, including the use of Doherty amplifier designs, envelope elimination and restoration, and linear amplification with nonlinear components. Another possible approach is to use Class S switching amplifiers for power amplification. Such amplifiers are attractive because they interface readily with the digital processing that is becoming ubiquitous in wireless base stations, and because Class S amplifiers have theoretical efficiencies near 100%.

One factor that may limit the suitability of Class S amplifiers is the coding efficiency. The coding efficiency determines how much of the total power expenditure in the amplifier is converted to electromagnetic energy within the desired spectral band, and not instead dissipated in out-of-band radio emission and through static and dynamic switching losses. Various approaches to coding have proven useful, such as sigma-delta modulation and pulsewidth modulation. However, there remains a need for further approaches to coding that offer the possibility of high efficiency.

SUMMARY OF THE INVENTION

We have developed a new signal coding technique for switching amplifiers, such as Class S amplifiers, that offers the possibility of significantly improved coding efficiency.

In an embodiment, our technique, as applied to amplify a time-varying signal having an amplitude component $A(t)$, includes:
  quantizing $A(t)$ to produce a time series $\hat{A}(t)$ having M levels;
  modulating a clock signal in response to $\hat{A}(t)$, thereby to produce a control signal;
  switching among at least three different power supply output levels in response to the control signal, thereby to generate an output pulse stream of positive and negative pulses, wherein the output pulse stream has three or more signal levels, and wherein each of the switched-output pulses is a correlate of a pulse of the clock signal; and
  filtering the output pulse stream, thereby to produce an output signal $s(t)$.

In embodiments, the output signal $s(t)$ is transmitted.

In embodiments, the modulating step is performed on frames of the clock signal, wherein each frame contains 2M pulses. Each modulated frame is associated with a portion of $\hat{A}(t)$ having a quantized signal level and a pulse code symbol identified with that level. For each of at least some frames, the modulating step configures the control signal to skip selected switched-output pulses in accordance with the pulse code symbol associated with that frame, wherein the pulses are skipped from frames that would otherwise each contain M positive and M negative pulses, and equal numbers of positive and negative pulses are skipped from each of those frames.

In embodiments, the time-varying signal that is to be amplified comprises a phase component $\phi(t)$ in addition to the amplitude component $A(t)$, and the method further comprises adding a time-varying delay to the clock signal in response to $\phi(t)$.

In embodiments, $\phi(t)$ is quantized to produce a time series $\hat{\phi}(t)$ having multiple levels, and adding a time-varying delay to the clock signal in response to $\hat{\phi}(t)$.

In another aspect, we have developed apparatus comprising a pulse-code modulator (PCM) and a switching amplifier. The pulse-code modulator (PCM) is configured to receive a clock signal and at least one data stream representing at least the amplitude component of an input signal, and further configured to generate a control signal in response to the clock signal and to at least one said data stream. The switching amplifier is configured to receive the control signal and to generate, in response to the control signal, a multilevel pulse stream by switching among three or more output signal levels that include at least a full-amplitude positive level, a full-amplitude negative level, and a zero level between said positive and negative levels.

In embodiments, the PCM is configured to:
  quantize the amplitude data stream into M levels;
  map each of the M levels to a pulse code symbol that spans a frame of the clock signal, each said clock frame defining M positive pulses interspersed with M negative pulses; and
  generate the control signal by modulating the clock signal with a stream of said pulse code symbols such that each said positive or negative pulse is admitted or skipped according to its position within the instant pulse code symbol.

The more efficient a code is, the more it concentrates signal power in the desired frequency band, i.e., the band to be used for transmission. Accordingly, the use of an efficient code reduces power loss in the output bandpass filter. The codes described here are designed to be relatively efficient. The concentration of power at the carrier frequency is readily seen, for example, in FIGS. 7, 8, and 9$b$, which are discussed below.

Switching loss is another mechanism that reduces power efficiency in the amplifier. Switching loss is the result of transient radiation and other transient dissipative processes that occur when the amplifier switches between ON and OFF, or between different signal levels. As a consequence, increasing the switching rate tends to increase the switching loss. By basing our codes on half-cycle pulses at the carrier frequency, with modulation by skipping some of the half-cycle pulses, we have been able to minimize the switching rate and thus we expect the codes to achieve relatively low switching loss.

The high code efficiency and low switching loss exhibited by our codes complement each other and lead to relatively high overall power efficiency.

BRIEF DESCRIPTION OF THE DRAWINGS

FIGS. 8a and 8b are output spectra, from numerical simulations, of the response of the model system to pulse codes in which the amplitude parameter a equals ⅓ and the number M of quantized amplitude levels equals 8 and 32, respectively.

FIG. 9b is the computed output spectrum corresponding to the signal of FIG. 9a.

DETAILED DESCRIPTION

Figure 1:
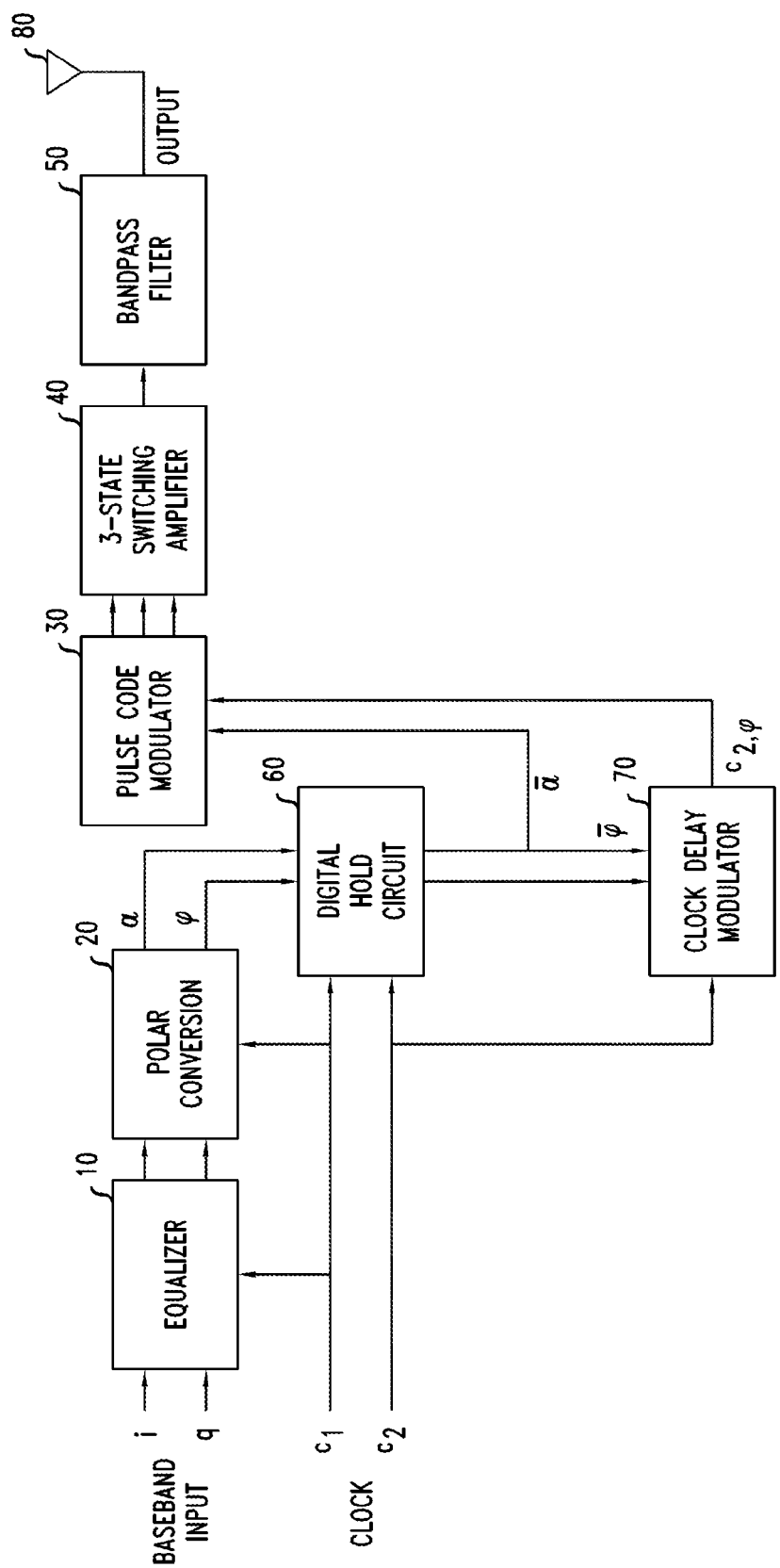
FIG. 1 is a conceptual block diagram of a switched amplifier according to an embodiment of the invention.

An exemplary embodiment of the invention will now be described with reference to FIG. 1. It will be understood that the particular division into functional blocks presented in the figure is purely illustrative and not meant to be limiting.

As seen in the figure, a time-varying baseband signal having an in-phase component i(t) and a quadrature component q(t) is input to equalizer 10. The i and q signals will typically be provided as signals in the digital domain. That is, i(t) and likewise q(t) is a bit serial or bit parallel stream of binary bits having a sample rate equal to the frequency of clock signal $c_1(t)$. Each sample is a block of, e.g., 8, 16, or 32 serial or parallel bits representing a sampled value of, respectively, the in-phase component or the quadrature component of an input baseband signal.

The i and q signals are input to equalizer 10, where well-known procedures are used to equalize the i and q signals insofar as may be necessary to compensate for the output bandpass filter, which will be described below. After equalization, the i and q signals are input to polar conversion module 20, where well-known procedures are used to convert them to a polar representation of the baseband signal having amplitude component A(t) and phase component φ(t). The clock signal $c_1(t)$ synchronizes the equalization and polar conversion processes.

A second clock signal $c_2(t)$ synchronizes pulse-code modulator 30. It should be noted in this regard that typical Class S amplifiers produce output directly at the carrier frequency $f_0$, without frequency upconversion. Accordingly, it will generally be desirable for the pulse-code modulator to control switching amplifier 40 in such a way that the switching amplifier can produce up to $f_0$ positive pulses and $f_0$ negative pulses per second. Thus, the clock signal $c_2(t)$ desirably has a rate of $2f_0$.

However, the baseband input signals i(t), q(t), and clock signal $c_1(t)$, will generally have a pulse rate that is much smaller than $f_0$. Accordingly, digital hold circuit 60 is provided to interpolate the sample values in A(t) and φ(t) onto streams having pulse rate $2f_0$. The resulting interpolated signals are here referred to as $\overline{A}(t)$ and $\overline{\phi}(t)$, respectively.

The interpolated amplitude signal $\overline{A}(t)$ is input as a control signal for pulse-code modulator 30, as will be explained in detail below. Although it is not always necessary, it will often be desirable to also use the interpolated phase signal $\overline{\phi}(t)$ to modulate the output of the Class S amplifier. Those skilled in the art will appreciate that there are several well-known techniques of phase modulation that may be applied.

One such technique is represented in FIG. 1 by clock-delay modulator 70. As shown in the figure, the clock-delay modulator is synchronized by clock signal $c_2(t)$, and controlled by the interpolated phase signal $\overline{\phi}(t)$. The clock-delay modulator applies a delay to the clock signal which varies according to the variations in $\overline{\phi}(t)$. The result is a variably delayed clock signal $c_{2,\phi}$, which is output as a synchronization signal for pulse-code modulator 30.

In systems that include phase modulation, it will often be desirable to quantize $\overline{\phi}(t)$, so that in each pulse interval, it takes one of a finite number of discrete values. Appropriate quantization techniques are well known. The quantization may, for example, be applied to φ(t) just prior to the digital hold circuit, or to $\overline{\phi}(t)$ just subsequent to the digital hold circuit.

In response to the input amplitude signal and the input synchronization signal, the pulse-code modulator 30 generates a multilevel control stream in accordance with a pulse code to be described below. The pulse-code modulator then transforms the multilevel control stream into a plurality (equal to the number of levels in the multilevel control stream) of switching control signals for respective output switching devices of multistate switching amplifier 40.

In typical implementations, the output of amplifier 40 will have three levels. Accordingly, modulator 30 may, for example, generate a ternary (i.e., three-level) control stream. The ternary control stream is converted to three switching control signals (as seen in the figure), and each switching control signal will control a respective output switching device connected to a source fixed at one of three signal levels. We refer to the three levels as a positive or +1 level, a negative, or −1 level, and a zero, or 0 level. The terms +1, 0, and −1 are for convenience, and are meant to be understood as representing relative, and not absolute or literal values. It should be noted that the implementation described here is merely examplary, and not limiting. For example, the control signal produced by modulator 30 may consist of multiple, parallel control streams instead of a one serial control stream as described here.

The following discussion will focus on ternary systems. However, it should be understood that this is merely for convenience, and not meant to be limiting. Extension to systems having four, five, or even more output levels will be readily achievable to those skilled in the art in view of the discussion below.

The pulse-code modulator creates the ternary (for example) control stream by quantizing $\overline{A}(t)$ in each clock interval to produce a series of quantized values $\hat{A}(t)$, mapping each quantized value to a pulse-code symbol, and outputting the pulse-code symbols. In the following discussion, the total number of possible quantized values is denoted by the symbol M. Useful values for M may be as small as 2, but in typical implementations, M will be 8, 16, 32, or even more.

For each possible quantized value, the corresponding pulse-code symbol is constructed from a block of M positive pulses interleaved with M negative pulses by skipping some number (which may be zero) of positive pulses and skipping an equal number of negative pulses. (In other implementations, as will be discussed below, additional signal output levels may be available for non-skipped pulses.)

Turning back to FIG. 1, it will be seen that the output from the switching amplifier is subjected to output bandpass filter 50 prior to transmission, as the signal s(t), from antenna 80. The greater the number of pulses that have been omitted from a given constellation symbol, the smaller will be the amplitude in the corresponding portion of the waveform transmitted from antenna 80. We introduce a parameter a, which is the desired amplitude (relative to maximum value) of the waveform s(t) which is output from filter 50 and transmitted.

One exemplary constellation of pulse-code symbols is provided in FIGS. 2a-2h. In that example, M equals 8. Accordingly, it will be seen that a symbol is constructed from sixteen pulses. FIG. 2h shows the symbol for a=1, in which (in this example) no pulses are omitted, positive symbols alternate with negative symbols so that a full cycle consists of one positive and one negative pulse, and the width of each pulse is one half cycle. As examination of the figure will make clear, however, there are also symbols in which a pulse of the same sign may be repeated without an intervening pulse of the opposite sign. It should be noted that in each of FIGS. 2a-2h, two successive instances of the same symbol are shown.

It will be seen in the figures that as a increases in increments of 0.125 (i.e., increments of 1/M) from 0.125 to 1, the number of omitted pulses decreases accordingly. Pulse codes will be discussed in more detail below.

Figure 3:
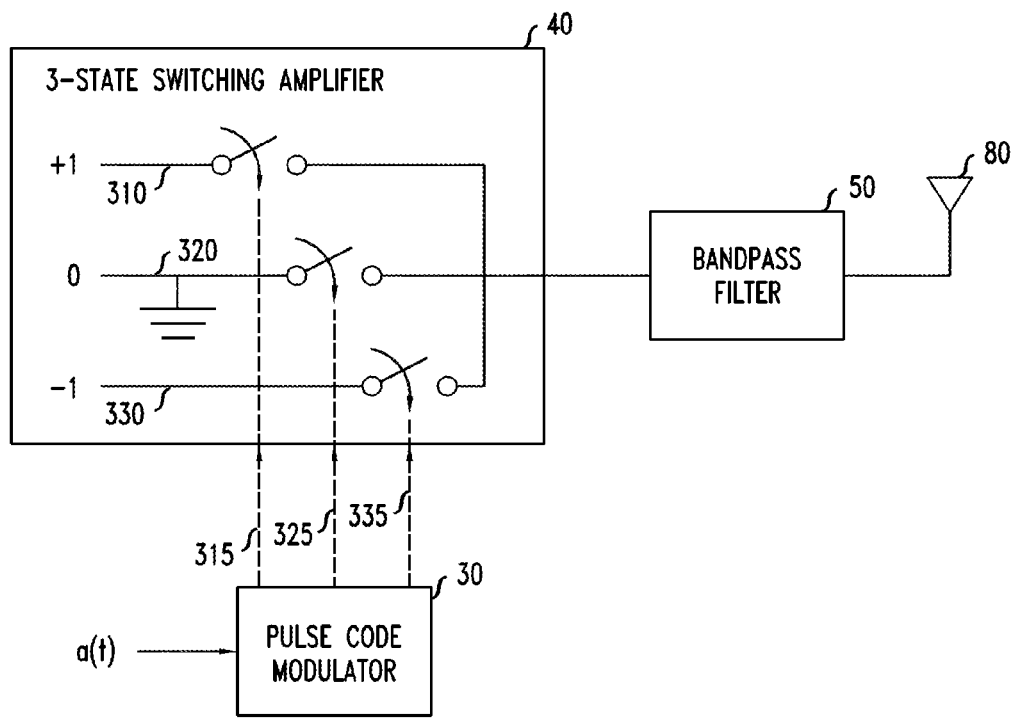
FIG. 3 is a detail of the switched amplifier of FIG. 1.

FIG. 3 provides further details of the three-state switching amplifier Like elements of FIGS. 1 and 3 are identified by like reference numerals. As seen in FIG. 3, switching amplifier 40 includes switched supply lines 310, 320, and 330, connected to power sources fixed at respective signal levels of +1, 0, and −1. Those skilled in the art will appreciate that amplifier 40 may operate in a voltage mode, in which case the power sources are constant voltage sources, or in a current mode, in which case the power sources are constant current sources. It will also be appreciated that when an amplifier similar to amplifier 40 has only two signal states (for example, a+1 and a−1 state, but no 0 state), it is known as, respectively, a voltage-mode Class S (VCMS) or a current-mode Class S (CMCS) amplifier.

The lines 310, 320, and 330 are respectively switched by control signals 315, 325, and 335 from pulse-code modulator 30. Referring back to FIG. 2, for example, control signal 315 is active and activates line 310 during clock intervals when a pulse of level +1 occurs in the instant code symbol. Likewise, control signal 325 is active and activates line 320 when a pulse of level 0 (i.e., a skipped pulse) occurs in the instant code symbol, and control signal 335 is active and activates line 330 when a pulse of level −1 occurs in the instant code symbol.

The output of amplifier 40 is the sum of the signals on the three lines (to which only the currently active line contributes).

With further reference to FIG. 3, bandpass filter 50 has a passband centered on the carrier frequency $f_0$. As those skilled in the art will understand, the particular bandwidth to be used depends on the specific practical application that is to be made of the transmission system. For 900-MHz CDMA transmitters, for example, a bandwidth of approximately 10 MHz may be desirable. It should be noted that there may be a practical upper limit on the bandwidth. That is, if the bandwidth is too wide, the envelope of the transmitted waveform may "droop"; i.e., it may exhibit transient behavior when a new pulse-code symbol is transmitted.

Each code symbol is defined as a sequence that extends over a duration of 2M half-cycles of the center frequency. However, the code can be updated by selecting a new symbol as often as once per each half-cycle. (This would result in a more gradual evolution of the transmitted pulse patterns.) This may be advantageous for tracking a signal amplitude that changes rapidly, although even so, the transmitted signal envelope will change on a timescale that is slow relative to the center frequency.

Hardware processors for performing the functions of equalizer, polar converter, digital hold circuit, and pulse-code modulator as illustrated in FIG. 1 are well known. Such processes may be performed, singly or in combination, by digital signal processors, special or general purpose digital computers, application-specific integrated circuits, field-programmable gate arrays, or other similar devices. Likewise, switching technology for the multistate switching amplifier and for the output bandpass filter is well known and need not be described here in detail.

Figure 12:
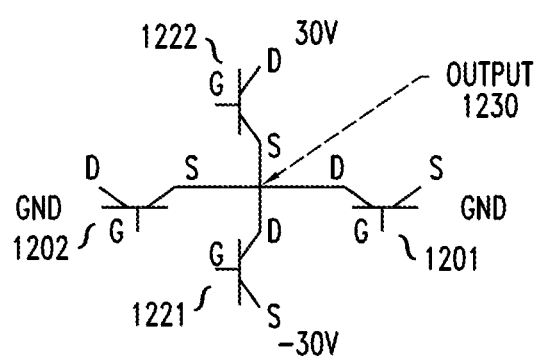
FIG. 12 is a simplified schematic diagram of a monolithic microwave integrated circuit (MMIC) for an exemplary implementation of a three-level switching amplifier.

FIG. 12, which is discussed in more detail below, provides one possible layout for a MMIC to perform three-level switching.

Several technologies are also known for making a clock-delay modulator, including all-digital technologies as well as technologies for making a digitally controlled analog delay device. It should be noted in this regard that the maximum controlled delay will be one cycle, which at a typical carrier frequency of 900 MHz will be 1.1 ns. In order to control the phase with a desirable degree of resolution, e.g. 1% resolution, it will be necessary to use a very high-speed component. At the current state of the art, it may be preferable to employ digitally controlled analog delay, because such high speeds are more accessible using that technology. It should also be noted that well-known direct digital, or digitally controlled analog, phase modulation techniques provide an alternative to such delay devices.

As noted above, pulse codes may be devised in which more than three signal output levels are represented in the coded pulse stream. For example, the pulses in the coded stream may have (positive and negative) full amplitude levels, i.e. the +1 and −1 levels, the 0 level, and one or more levels of less than full amplitude. A less than full-amplitude pulse is a pulse whose amplitude is intermediate between the 0 level and the +1 level, or intermediate between the 0 level and the −1 level. Additional supply levels are readily added to a three-level system such as amplifier 40 of FIG. 3 to support the further signal output levels.

Figure 2:
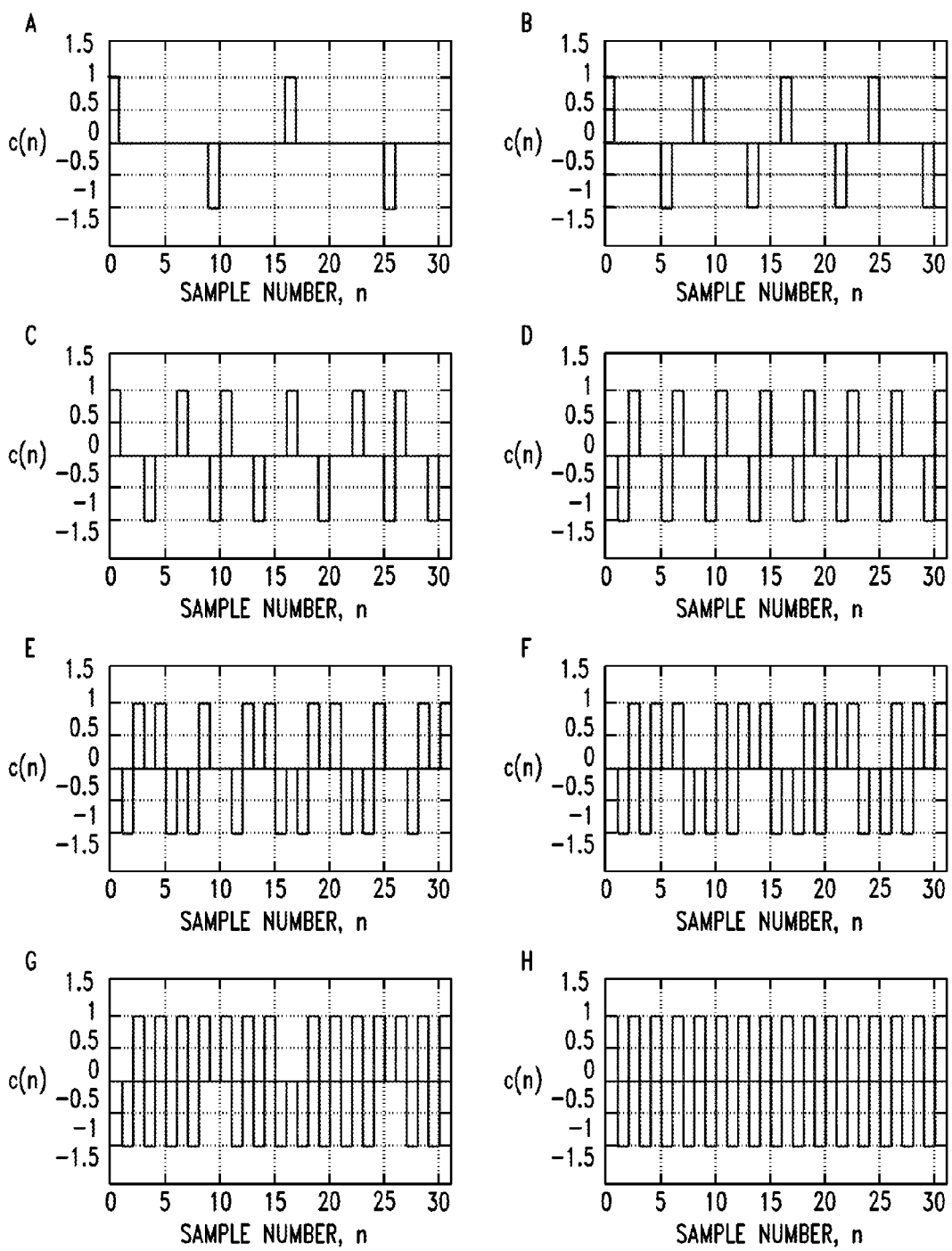
FIGS. 2$a$-2$h$ depict the constellation symbols of an exemplary pulse code that may be used in an embodiment of the invention.

FIG. 2, discussed above, provides one example of a pulse-skipping code, i.e., of a pulse code in which selected positive and negative pulses are omitted. More generally, our coding technique seeks to achieve a desired level a of the quantized output amplitude by interspersing a corresponding number of positive and negative pulses within a time window of M cycles (i.e., of 2M half-cycle sample intervals) in a pattern that is balanced so as to minimize variations in the envelope of the transmitted waveform s(t), which we refer to as "envelope droop".

In codes having more than three levels, the code symbols may be designed, for example, such that a weighted sum of the pulses in each symbol is proportional to the desired signal output amplitude a. In such a sum, each full-amplitude pulse might, for example, contribute the value "1", whereas each pulse of less than full amplitude would contribute a smaller value equal to its amplitude as a fraction of full amplitude.

Figure 4:
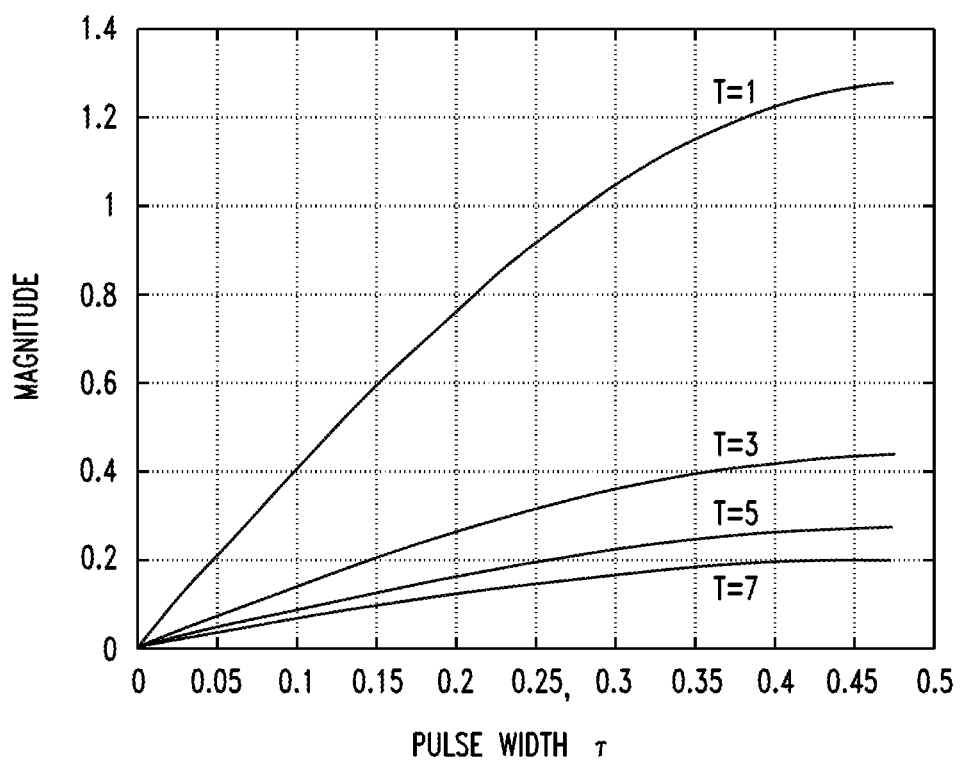
FIG. 4 is a plot showing the effects of pulse width and pulse skipping on the transmitted signal amplitude from numerical simulations of a switched amplifier according to an embodiment of the invention.
Figure 5:
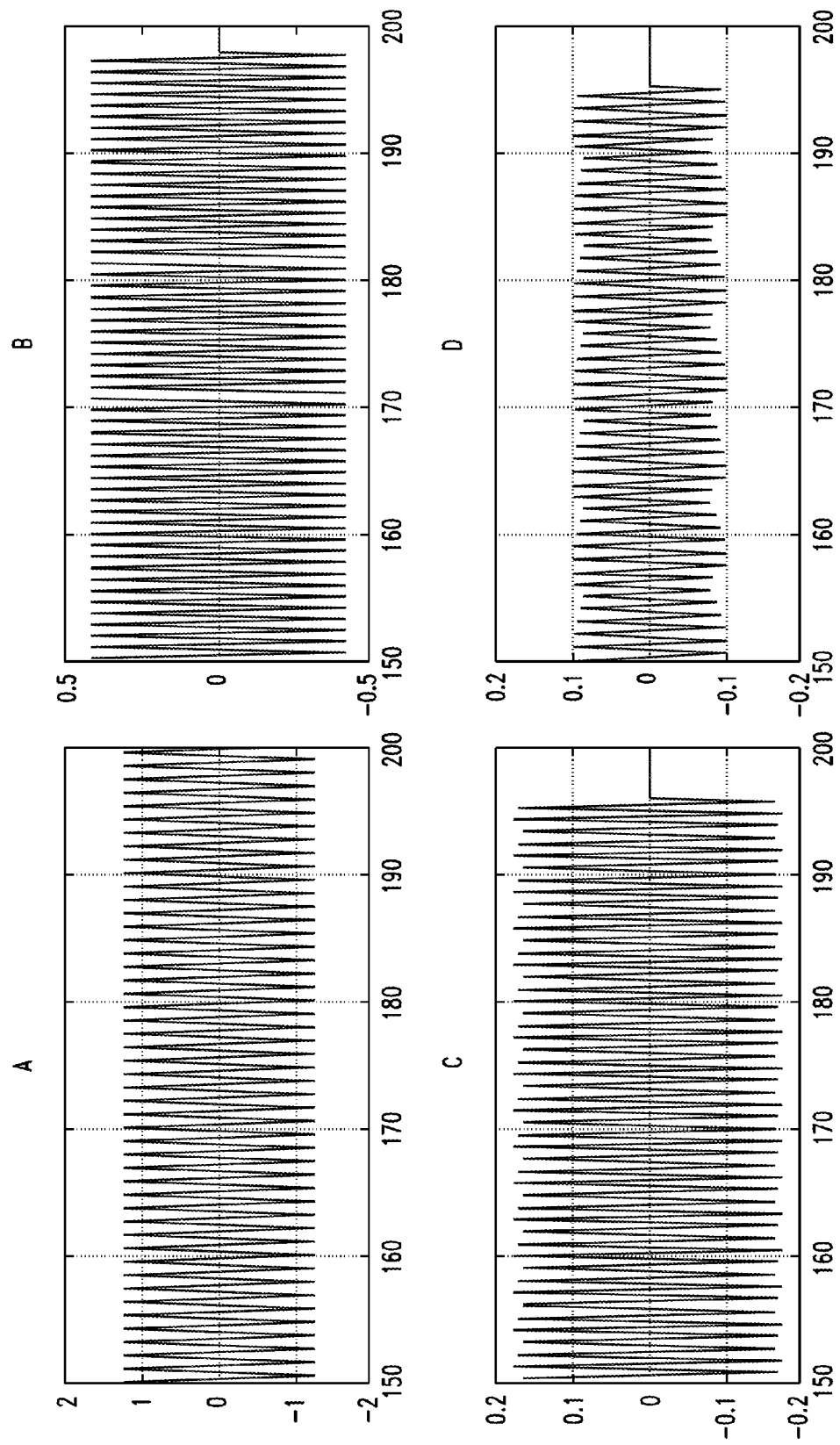
FIGS. 5a-5f are plots of the output signal as predicted from numerical simulations of a switched amplifier according to an embodiment of the invention. Each of FIGS. 5a to 5f corresponds to a respective value of the pulse-skipping parameter T.
Figure 5:
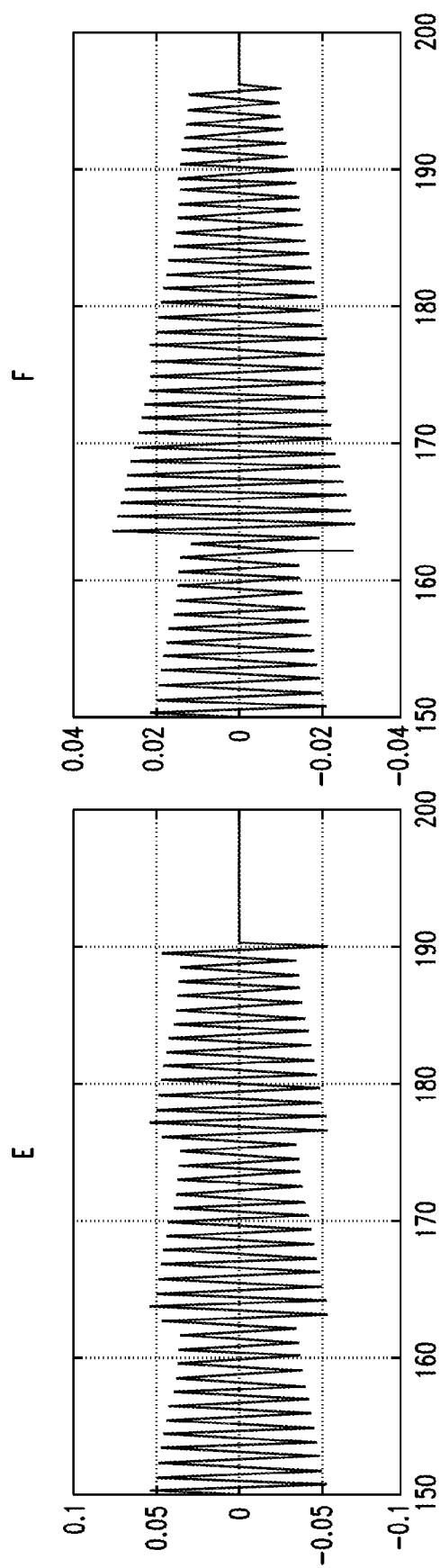

A better understanding of the relationship between the number of skipped pulses and the transmitted amplitude may be gained from FIG. 4. In the figure, we have plotted the results of a simulation in which the width of the positive and negative pulses is continuously varied from zero to 50% of a full cycle (at the center frequency), and the pulse-skipping parameter T is incrementally varied over the values 1, 3, 5, and 7. The parameter T is defined such that the fractional number of pulses that are skipped in a given code symbol is $$\frac{T-1}{T}.$$

Four curves are visible in the figure, representing, in sequence from top to bottom, T=1, 3, 5, and 7. It will be seen for all four curves that the transmitted amplitude increases with the pulse width τ. We have also found that the greatest efficiency is achieved when τ=0.5.

A better understanding of the envelope droop that we seek to minimize may be gained from FIGS. 5a-5f. There, we have plotted the results of a simulation in which, going in order from FIG. 5a to FIG. 5f, T ranges incrementally over the values 1, 3, 7, 13, 27, and 65. Transient effects on the shape of the envelope are clearly apparent at T=13, and they are seen to be already severe at T=27. In the simulations, τ=0.49. The simulation treated the combined output bandpass filter and antenna (operating as a radiative load) as a second-order RLC filter having a damping factor ξ=0.005 related to the Q factor by $$Q = \frac{1}{2\zeta}.$$

The damping factor is given in this model by $$\zeta = \frac{R}{2}\sqrt{\frac{C}{L}},$$

where R, C, and L have their usual meanings as resistance (including the radiative load), capacitance, and inductance. As a general rule, the envelope droop will become significant as the time between pulses grows to be a significant fraction of the RLC time constant.

In our codes, the positive and negative pulses must be placed so as to reinforce the resonant response of the circuit. This will occur if the positive pulses are placed at positive half-cycles of the carrier-frequency clock signal, and negative pulses are placed at negative half-cycles.

As seen in FIGS. 2a-2h, symbols for a less than 0.5 will have fewer active pulses than skipped pulses. This makes it possible to design the symbol by, for example, first spacing the positive pulses as uniformly as possible over the symbol period, and then interspersing the negative pulses as evenly as possible between the posititive pulses, so as to minimize the variation in the (smoothed) amplitude. Conversely, when a is greater than 0.5, there will be more active pulses than skipped pulses. In that case, the holes (i.e. the skipped pulse positions) can be distributed in the same manner as the pulses are distributed for a<0.5.

Figure 6:
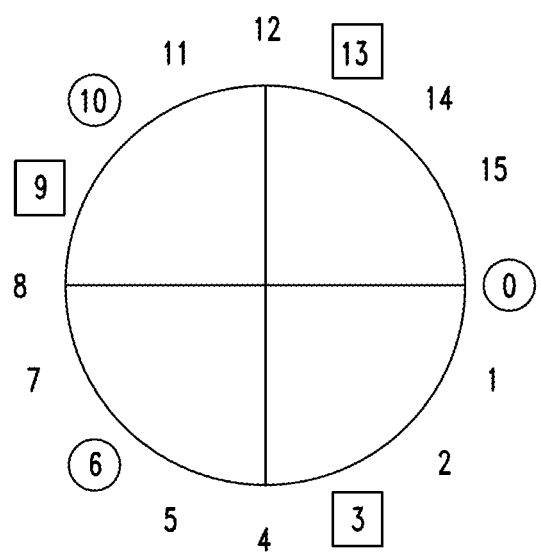
FIG. 6 is a representation of the code symbol of FIG. 2c in which the pulses and holes (i.e., skipped pulse positions) are arranged around the unit circle, representing one symbol period.

FIG. 6 shows the code symbol of FIG. 2c (a=0.375) in a more conceptual format, in which the pulses and holes are spaced around the unit circle, which represents the symbol period. Each of the 2M=16 pulse positions is numbered. The pulse positions populated by a positive pulse are designated by a small circle, and those populated by a negative pulse are designated by a small square. Thus, it will be seen that positive pulses occur at positions 0, 6, and 10, and negative pulses occur at positions 3, 9, and 13. In this representation, positive pulses must be placed at even-numbered positions, and negative pulses at odd-numbered positions. Because 16 is not evenly divisible by 3, the distribution that is shown represents a best approximation to the ideal distribution.

The transient effects that we have referred to as "envelope droop" tend to be most prevalent at low input levels, such as may result from a high percentage of skipped pulses. Envelope droop is undesirable because it tends to increase the error vector magnitude. One possible strategy for mitigating envelope droop is to combine pulse skipping with pulse-width modulation, i.e., with modulation by varying the parameter τ. Another possible strategy, which has greater power efficiency, is to design codes so that they include more than three signal output levels. Either strategy may help to balance the code symbols in such a way that envelope droop is mitigated.

We will now discuss a general approach for designing a pulse code for amplitude modulation in our three-state Class S scheme. As explained above, we initially define an amplitude resolution of M levels ($\log_2$ M bits) and associate this with a period of M cycles of the central radiofrequency (RF) wave, or 2M half-cycles. The amplitude signal is assumed to be sampled at 2 samples per cycle, so there are 2M samples to specify in one code period.

We adopt a strategy of interspersing positive and negative pulses over the 2M-sample code period in an optimally balanced way, so as to minimize envelope droop of the resulting bandpass filtered output.

We will assume that the amplitude a is scaled so that 0≤a≤1 We initially consider the case a=½, for which there will be fewer active pulses than skipped pulses.

We define P=round(Ma) as the number of positive (and negative) pulses over the code period. We then space the positive pulses as equally as possible at even-numbered samples $n_+$, and we optimally intersperse the negative pulses at odd-numbered samples $n_-$, where $n_+$ and $n_-$ are given by:

$$n_+ = 2 \cdot \text{round}\left(\frac{0:P-1}{P}M\right)$$

$$n_- = n_+ + 2 \cdot \text{round}\left(\frac{(M/P)-1}{2}\right) + 1$$

The expression "0: P−1" means the integer sequence 0, 1, 2, . . . , P−1. The expression "round( . . . )" takes the integer value that is nearest the value of its argument. The last two additive terms in the expression for $n_-$ specify the offset between the negative and positive pulses and assure odd sample numbers for the negative pulses.

For a>½, the roles of the active pulses and the holes are interchanged, so that the number of positive (and negative) holes per code period is P̃=round(M−Ma), and the spacing and interleaving are as specified above.

In regard to phase modulation, we note that the signal representation of a narrowband process centered at $\omega_0$ is given by $$x(t)=a(t)\cos[\omega_0 t+\phi(t)],$$

where a(t) is the magnitude and φ(t) is the phase. The above expression can be rewritten as $$x(t)=a(t)\cos[\omega_0(t-v(t))],$$

where $$v(t) = \left(1 - \frac{\varphi(t)}{2\pi}\right) \cdot \frac{1}{f_0}, f_0 = \omega_0/2\pi, \text{ and } \left(1 - \frac{\varphi(t)}{2\pi}\right)$$

is the delay, expressed as a positive fraction of one cycle, at the center frequency (in Hertz) $f_0$.

Assuming that the narrowband approximation is valid, the amplitude time delay can be neglected and therefore the time-varying delay v(t) can be implemented in, e.g., the three-state scheme by modulating the clock delay or by using phase-modulation techniques, as discussed above.

EXAMPLE 1

Figure 7A:
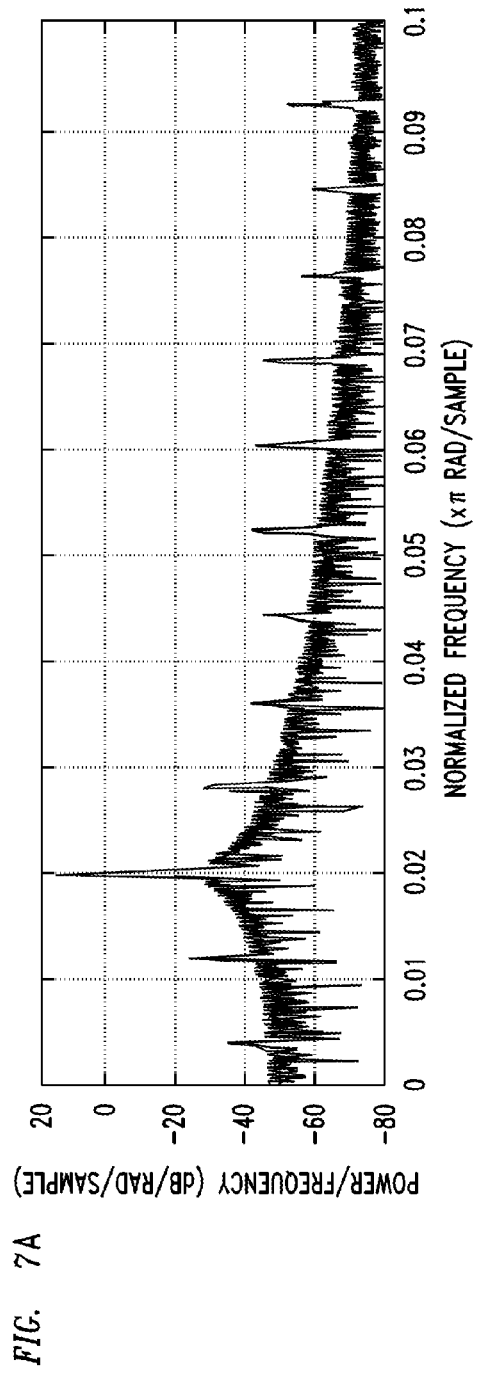
FIG. 7a is a spectrum of an output signal from a model system according to an embodiment of the invention, as predicted from numerical simulations. The pulse-skipping parameter T equals 5 and the pulse-width parameter τ equals 0.5. For comparison.

We performed a numerical simulation of the response of our model system, with a damping factor of 0.005, to a sequence of positive and negative pulses having T=5 and τ=0.5. We took 100 samples per cycle, extended the computation to 200 cycles, and took the last 100 cycles as representative of steady-state behavior. We performed a spectral analysis of the resulting 10,000-sample segment using a Hamming window. The result is shown in FIG. 7a. For a better understanding of the figure, it should be noted that for computational convenience, and without loss of generality, we normalized the center frequency to 1 Hz. As seen in the figure, the center frequency occurs at a normalized frequency of 0.02, which reflects a further normalization factor due to our sampling at 100 samples per cycle and considering the Nyquist rate of two samples per cycle.

A sequence of spurious tones, which we refer to as spectral "spurs", are seen in the figure, at frequencies (relative to a center frequency of 1 Hz) of 0.2 Hz, 0.4 Hz, 0.6 Hz, 1.4 Hz, 1.8 Hz, etc. The spacing between successive spurs is 1/T, which in this example is 0.2 Hz.

Figure 7B:
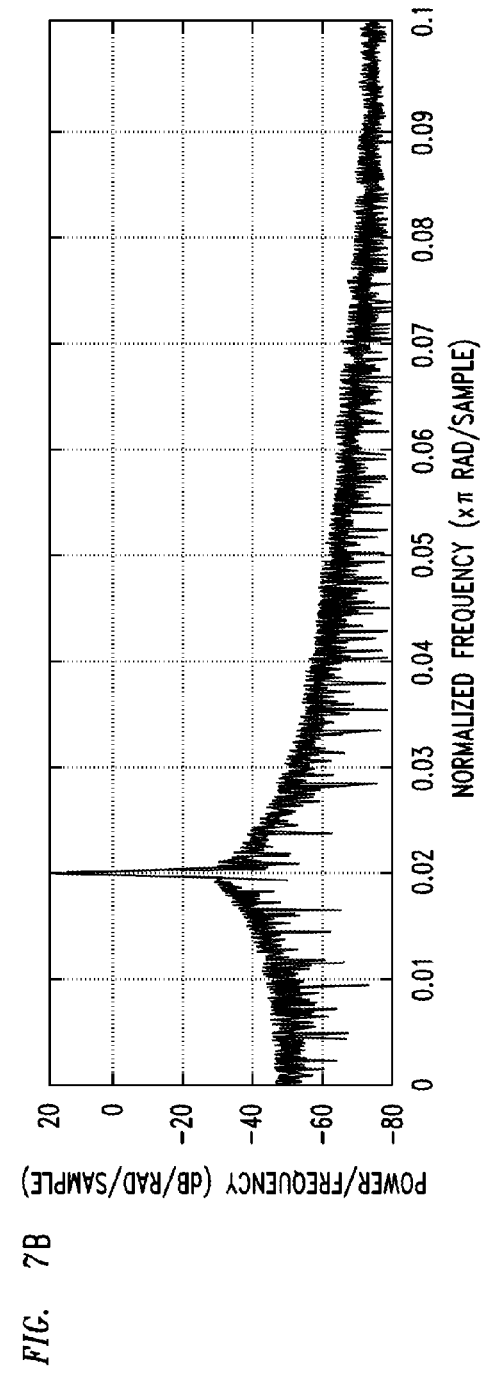
FIG. 7b is a corresponding spectrum of a pure tone.

For comparison, FIG. 7b is the spectrum of a pure tone at the center frequency.

As the number of skipped pulses increases, the spurs will become more densely spaced, but their respective amplitudes relative to the center frequency will remain roughly constant. The net effect will be to increase the total relative waveform error power, which in the time domain will increase the error vector magnitude.

EXAMPLE 2

FIGS. 8a and 8b show output spectra for simulations of the response of our model system to pulse codes, as described here, in which a=⅓ and M equals 8 and 32, respectively. The computation was similar to that of Example 1. Comparison of the two spectra shows that when the number of amplitude quantization levels is reduced, additional spurs appear (due to intermodulation) between the main spurs that are associated with pulse skipping. From these results, we expect that intermodulation will not present intolerable difficulties at least when M is at least 8.

EXAMPLE 3

Figure 9A:
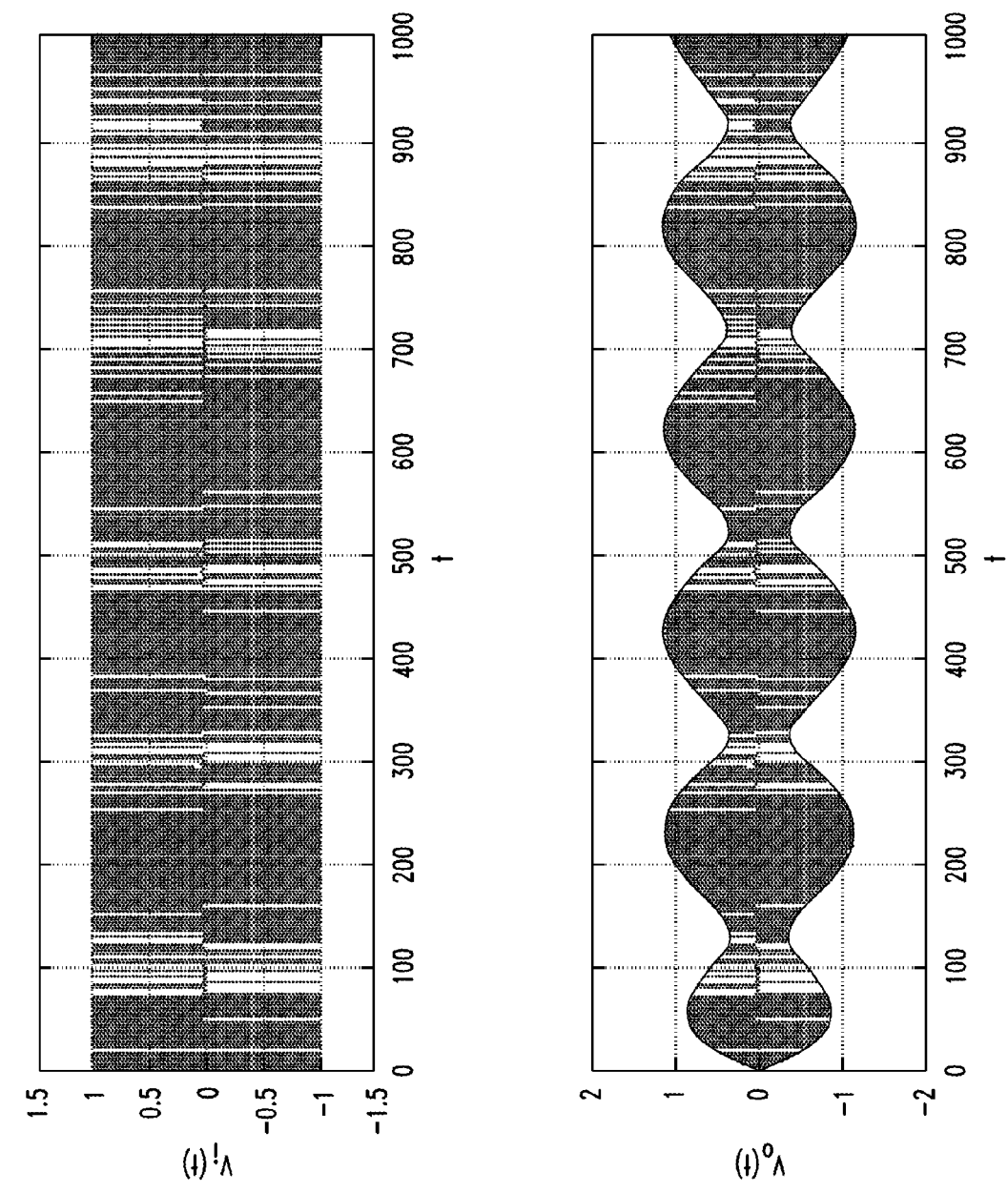
FIG. 9a is a pair of plots showing results of a simulation of pulse-code amplitude modulation combined with phase modulation according to an embodiment of the invention. The input signal is a two-tone suppressed carrier signal. The pulse code uses M=16 quantized amplitude levels. The upper plot is the waveform for the coded input signal. The lower plot is the output waveform.
Figure 9B:
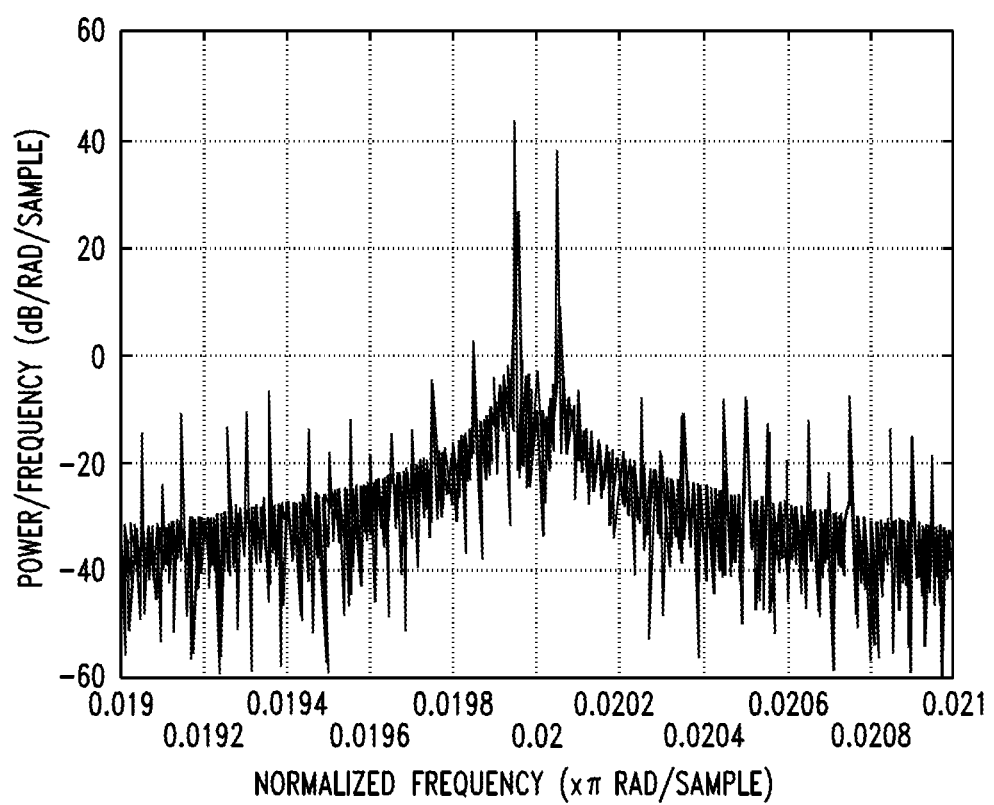

FIGS. 9a and 9b provide a simple example of pulse-code amplitude modulation combined with phase modulation. Our simulation was modified to include phase modulation according to the clock-delay technique described above, but was otherwise similar to the preceding two examples. We computed the response of our model system to a two-tone suppressed carrier signal x(t), coded with M=16.

The input signal is given by x(t)=α cos($\omega_0$+Δ)t+(1−α)sin ($\omega_0$−Δ)t, where 0≤α≤1 controls the ratio of tone amplitudes and Δ is the tone spacing above and below the center frequency $\omega_0$. The amplitude a(t) and phase φ(t) of the input signal are respectively given by $$a(t) = [1 - 2\alpha + 2\alpha^2 + 2\alpha(1-\alpha)\cos 2\Delta t]^{1/2}$$

$$\varphi(t) = \tan^{-1}\left[(2\alpha - 1)\frac{\sin\Delta t}{\cos\Delta t}\right]$$

The upper view in FIG. 9a is the waveform for the coded input signal for α=⅓, and the lower view is the corresponding output waveform. It will be seen that the output amplitude varies as a quasi-sinusoid between limits of 0.33 and 1 as expected from the above equations. FIG. 9b is the corresponding steady-state spectrum. It will be seen that as expected, the center frequency is suppressed and (in accordance with the value of ⅓ for α) the upper and lower sidebands differ in level by 6 dB (i.e., a factor of 2).

EXAMPLE 4

To characterize the potential performance of our system with a more realistic representation of actual communication signals, we coded, with M=16, a random baseband signal formed by the lowpass filtering of complex white Gaussian noise. Our lowpass filter was a finite impulse response (FIR) filter with 1000 coefficients and a normalized cutoff frequency (relative to the 2-Hz envelope sampling rate) of 0.0025. This arrangement produces an upconverted bandpass signal of normalized bandwidth 0.005, or 0.25% at the carrier frequency, which spans ¼ of the 1% bandwidth associated with the system RLC bandpass filter in our model.

Figure 10A:
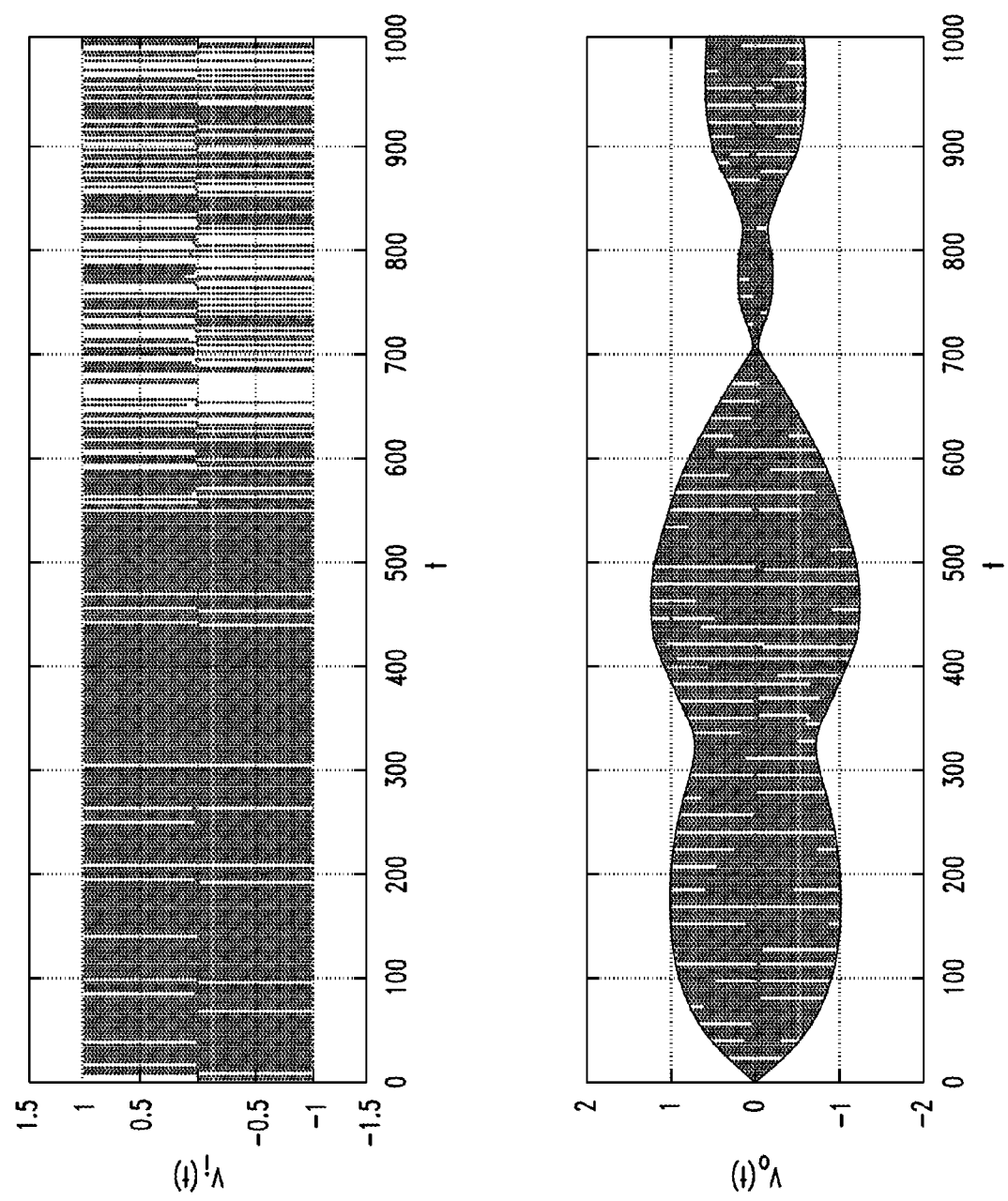
FIG. 10a is a pair of plots showing results of another simulation of pulse-code modulation. The input signal is a random baseband signal formed by the lowpass filtering of complex white Gaussian noise. The pulse code uses M=16 quantized amplitude levels. The upper plot is the waveform for the coded input signal. The lower plot is the output waveform.
Figure 10B:
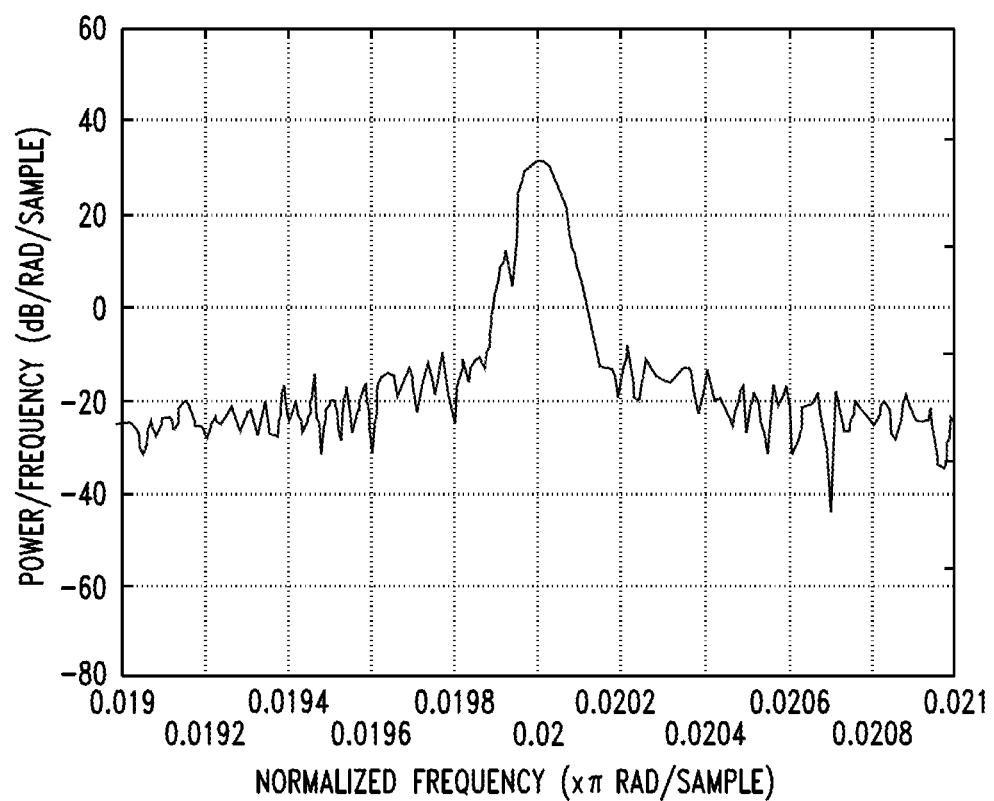
FIG. 10b is the resulting computed output spectrum.

FIG. 10a shows the input code (upper trace) and the output (lower trace) of our simulation. FIG. 10b shows the corresponding output power spectrum. The 0.25% fractional bandwidth seen in FIG. 10b causes the envelope of the 1-Hz carrier to vary, while exhibiting a high degree of correlation, over about 400 seconds as seen in FIG. 10a. (It will be understood that in our normalization, a duration of one second corresponds to one cycle at the carrier frequency.)

Figure 11:
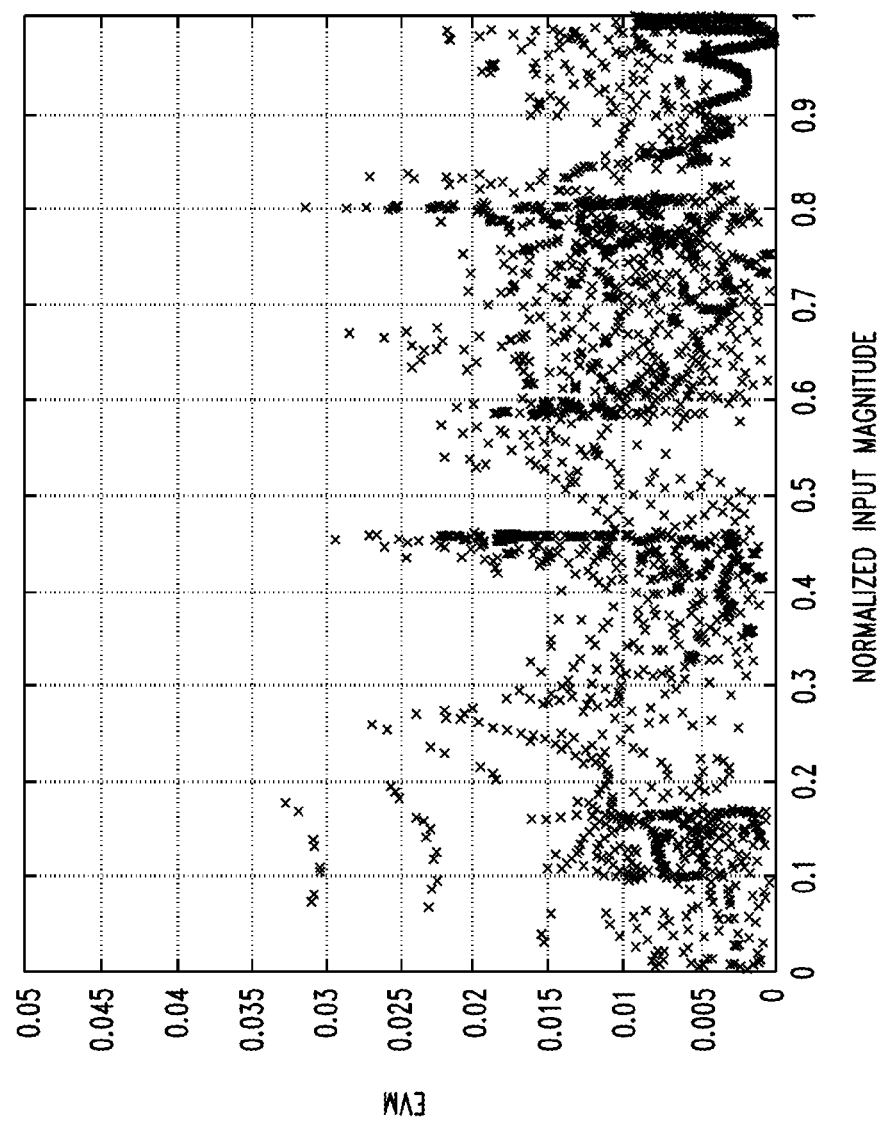
FIG. 11 is an error plot corresponding to the coding example of FIGS. 10a and 10b.

FIG. 11 is a plot of complex error-vector magnitude as a function of the magnitude of the input signal, obtained from a comparison between the complex demodulated output signal and the complex baseband input signal. In the figure, each of 2000 samples is denoted by an "×". The complex error vector ϵ between the complex input signal vector x and the complex output signal vector x̂ is given by ϵ=x−βx̂, where β is a complex scale factor. We choose the value of β that minimizes the error vector magnitude (EVM). As is well known, the error-minimizing value $\beta_{opt}$ is given by $$\beta_{opt} = \frac{\hat{x}^H x}{\|\hat{x}\|^2},$$

where the superscript "H" denotes the conjugate transpose. The quantity $\|\epsilon\|$ plotted in the figure is the EVM.

In an actual implementation, the respective signal envelopes would be temporally aligned by adding appropriate time delay to the input signal, and linear distortion by the system bandpass filter might be compensated using, e.g., an equalization filter. In our simulation, we did not explicitly model these details. Instead, we filtered the baseband input signal, as explained below, prior to comparing it with the demodulated scaled output signal.

The filter for the baseband input signal was a representation of the RLC bandpass filter of the model we have described above. More specifically, it was a first-order infinite impulse response (IIR) lowpass filter with recursive coefficient $1-\zeta\pi$, where as above the damping coefficient $\zeta=0.005$.

In the figure, we plotted the normalized error vector magnitudes as a function of the normalized input magnitude for the simulation example of FIGS. 10a and 10b. It will be seen from the figure that the EVM has an average value of about 1%, and only rarely exceeds 2%.

EXAMPLE 5

FIG. 12 provides an example of a possible layout for a MMIC to perform the switched amplifier function in the voltage mode. As seen in the figure, four gallium nitride (GaN) high-power microwave transistors are provided on a substrate. The respective source (S) and drain (D) leads of transistors 1201 and 1202 are tied to ground (the "0" signal output level). The source lead of transistor 1221 is tied to a +30 V supply line (the "−1" signal output level), and the drain lead of transistor 1222 is tied to a +30 V supply line) (the "+1" signal output level). The drain leads of transistors 1201 and 1221 and the source leads of transistors 1202 and 1222 are connected to the output contact 1230. Switching of the 0 output level is achieved by activating transistors 1201 and 1202 by means of an effective voltage applied to their gate (G) electrodes. Switching of respectively the −1 and +1 output levels is achieved by activating transistors 1221 and 1222 by means of an effective voltage applied to their gate electrodes.

The invention claimed is:

1. A method for processing a time-varying signal having an amplitude component A(t), comprising:
   quantizing A(t) to produce a time series Â(t) having M levels;
   modulating a clock signal in response to Â(t), thereby to produce a control signal, wherein:
      the modulating step is performed on frames of the clock signal, each frame containing 2M pulses, wherein M is a nonzero integer;
      each modulated frame is associated with a portion of Â(t) having a quantized signal level and a pulse code symbol identified with said level; and
      for each of at least some frames, the modulating step configures the control signal to skip selected switched-output pulses in accordance with the pulse code symbol associated with that frame based on a parameter that is incrementally varied over a range of determined values for selecting an amount of skipped pulses in a given pulse code symbol;
   switching among at least three different power supply output levels in response to the control signal, thereby to generate an output pulse stream of positive and negative pulses, wherein the output pulse stream has three or more signal levels, and wherein each of the switched-output pulses is a correlate of a pulse of the clock signal; and
   filtering the output pulse stream, thereby to produce an output signal s(t).

2. The method of claim 1, further comprising transmitting s(t).

3. The method of claim 1, wherein:
   the pulses are skipped from frames that would otherwise each contain M positive and M negative pulses; and
   equal numbers of positive and negative pulses are skipped from each said frame.

4. The method of claim 3, wherein the power supply output levels are a +1 level, a −1 level, and a 0 level, and the 0 level is the output level that corresponds to the skipped pulses.

5. The method of claim 3, wherein the number of switched-output pulses that remain in each frame after pulse skipping is proportional to the quantized signal level for that frame.

6. The method of claim 3, wherein:
   the switched power supply output levels include a +1 level, a 0 level, a −1 level, and at least two intermediate amplitude levels lying between the 0 level and respectively the +1 and −1 levels; and
   at least some of the switched-output pulses are generated at the intermediate amplitude levels.

7. The method of claim 1, wherein each of the power supply output levels corresponds to an output level of electric current.

8. The method of claim 1, wherein each of the power supply output levels corresponds to an output voltage level.

9. The method of claim 1, wherein s(t) has a center frequency that is a carrier frequency for transmission of s(t) from an antenna, and the clock signal determines said center frequency.

10. The method of claim 1, wherein the time-varying signal comprises a phase component φ(t) in addition to the amplitude component A(t), and the method further comprises adding a time-varying delay to the clock signal in response to φ(t).

11. The method of claim 1, wherein the time-varying signal comprises a phase component φ(t) in addition to the amplitude component A(t), and the method further comprises quantizing φ(t) to produce a time series {circumflex over (φ)}(t) having multiple levels, and adding a time-varying delay to the clock signal in response to {circumflex over (φ)}(t).

12. Apparatus, comprising:
   a pulse code modulator (PCM) configured to:
      receive a clock signal and at least one data stream representing at least the amplitude component A(t) of an input signal; generate a control signal in response to the clock signal and to at least one said data stream;
      quantize the amplitude data stream into M levels;
      map each of the M levels to a pulse code symbol that spans a frame of the clock signal, each said clock frame defining M positive pulses interspersed with M negative pulses; and
      generate the control signal by modulating the clock signal with a stream of said pulse code symbols such that each said positive or negative pulse is admitted or skipped according to its position within the instant pulse code symbol based on a parameter that is incrementally varied over a range of determined values for selecting an amount of skipped pulses in a given pulse code symbol; and
   a switching amplifier configured to receive the control signal and to generate, in response to the control signal, a multilevel pulse stream by switching among three or more output signal levels that include at least a full-amplitude positive level, a full-amplitude negative level, and a zero level between said positive and negative levels.

13. The apparatus of claim 12, wherein the output signal levels are +1, −1, and 0, and the amplifier switches to the 0 level for each skipped pulse.

14. The apparatus of claim 12, wherein the output signals include a +1 level, a −1 level, a 0 level, at least one intermediate amplitude level between 0 and +1, and at least one intermediate amplitude level between 0 and −1.

15. The apparatus of claim 12, wherein the switching amplifier is a current-mode amplifier.

16. The apparatus of claim 12, wherein the switching amplifier is a voltage-mode amplifier.

17. The apparatus of claim 12, wherein the pulse stream generated by the switching amplifier has a center frequency that is a carrier frequency for transmission, the clock signal determines said center frequency, and the apparatus further comprises a bandpass filter centered at the carrier frequency and an antenna configured to transmit the pulse stream generated by the switching amplifier after it has been filtered by the bandpass filter.

18. The apparatus of claim 12, wherein the pulse code modulator is configured to generate the control signal in response to the clock signal, to the amplitude data stream, and to a further data stream representing a phase component of the input signal.

19. The apparatus of claim 18, further comprising a clock delay modulator configured to add delay to the clock signal in response to the phase data stream, thereby to add phase modulation to the control signal generated by the pulse code modulator.

* * * * *